United States Patent
Kaldewey et al.

(10) Patent No.: US 10,411,732 B2
(45) Date of Patent: Sep. 10, 2019

(54) PARALLEL LEMPEL-ZIV COMPRESSION FOR HIGHLY-PARALLEL COMPUTER ARCHITECTURES

(71) Applicant: INTERNATIONAL BUSINESS MACHINES CORPORATION, Armonk, NY (US)

(72) Inventors: Tim Kaldewey, Philadelphia, PA (US); Rene Mueller, San Jose, CA (US); Evangelia Sitaridi, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 15/431,636

(22) Filed: Feb. 13, 2017

(65) Prior Publication Data
US 2018/0234110 A1   Aug. 16, 2018

(51) Int. Cl.
| | | |
|---|---|---|
| H03M 7/38 | (2006.01) | |
| H03M 7/30 | (2006.01) | |
| G06F 12/0846 | (2016.01) | |
| G06F 12/0862 | (2016.01) | |

(52) U.S. Cl.
CPC ...... H03M 7/6023 (2013.01); G06F 12/0848 (2013.01); G06F 12/0862 (2013.01); H03M 7/3086 (2013.01); H03M 7/6058 (2013.01); G06F 2212/282 (2013.01); G06F 2212/401 (2013.01); G06F 2212/602 (2013.01)

(58) Field of Classification Search
CPC .............................. G06F 9/5066; H03M 7/30
See application file for complete search history.

(56) References Cited

U.S. PATENT DOCUMENTS

| | | | |
|---|---|---|---|
| 5,179,378 A | * | 1/1993 | Ranganathan ...... H03M 7/3086 341/51 |
| 6,693,567 B2 | | 2/2004 | Cockburn et al. |
| 8,106,799 B1 | | 1/2012 | Yang et al. |
| 9,319,066 B2 | | 4/2016 | Master et al. |
| 9,479,194 B2 | | 10/2016 | Mizushima et al. |
| 9,484,954 B1 | | 11/2016 | Gopal et al. |

(Continued)

OTHER PUBLICATIONS

Chlopkowski, M. et al., "A General Purpose Lossless Data Compression Method for GPU", Journal of Parallel and Distributed Computing, Jan. 2015, pp. 40-52, vol. 75, Issue C, United States.

(Continued)

*Primary Examiner* — Ryan Bertram
*Assistant Examiner* — Trang K Ta
(74) *Attorney, Agent, or Firm* — Sherman IP LLP; Kenneth L. Sherman; Hemavathy Perumal

(57) ABSTRACT

One embodiment provides a method comprising receiving an input data stream, partitioning the input data stream into a plurality of data blocks, and compressing the data blocks utilizing a plurality of processor sets. Each processor set is assigned a data block to compress. The processor sets compress in parallel to exploit inter-block parallelism. Each processor set comprises one or more processors that collaborate in compressing an assigned data block to exploit intra-block parallelism. The method further comprises writing a plurality of compressed data blocks resulting from the compressing to a storage device in encoded form.

20 Claims, 13 Drawing Sheets

(56) References Cited

U.S. PATENT DOCUMENTS

2008/0313484 A1* 12/2008 Ratakonda ............ G06F 9/5066
                                                            713/375
2011/0285556 A1* 11/2011 Nov ........................ H03M 7/30
                                                            341/51
2016/0283159 A1*  9/2016 Gopal ................... G06F 3/0638
2017/0103085 A1   4/2017 Kataoka et al.

OTHER PUBLICATIONS

Tan, L.S. et al., "Optimizing LZW Text Compression Algorithm via Multithreading Programming", Proceedings of the 2009 IEEE 9th Malaysia International Conference on Communications, Dec. 15-17, 2009, pp. 592-596, IEEE, United States.

Mehboob, R. et al., "High Speed Lossless Data Compression Architecture", Proceedings of the 2006 Multitopic Conference (INMIC'06), Dec. 23-24, 2006, pp. 84-88, IEEE, United States.

Shun, J. et al., "Practical Parallel Lempel-Ziv Factorization", Proceedings of the 2013 Data Compression Conference (DCC'13), Mar. 20, 2013, pp. 123-132, IEEE Computer Society, United States.

Ziv, J., "A Universal Algorithm for Sequential Data Compression", Proceedings of the IEEE Transactions on Information Theory, May 1977, pp. 337-343, vol. IT-23, No. 3, IEEE, United States.

List of IBM Patents or Applications Treated as Related.

List of IBM Patents or Applications Treated as Related; Kaldeway, T., U.S. Appl. No. 16/428,754, filed May 31, 2019.

* cited by examiner ions, and more particularly, to a parallel Lempel-Ziv data
PARALLEL LEMPEL-ZIV COMPRESSION FOR HIGHLY-PARALLEL COMPUTER ARCHITECTURES The present invention generally relates to data compression, and more particularly, to a parallel Lempel-Ziv data compression scheme for highly-parallel computer architectures.

BACKGROUND

A highly-parallel computer architecture has a larger processor count as it comprises a large number of processor devices. Examples of highly-parallel computer architectures include multi-core processor systems such as, but are not limited to, Graphics Processor devices (GPUs), Field-Programmable Gate-Arrays (FPGAs), Massively-Parallel Processor Arrays (MPPAs), etc. Conventional data compression algorithms that are inherently sequential in nature do not effectively exploit the high degree of parallelism that highly-parallel computer architectures provide.

SUMMARY

One embodiment provides a method comprising receiving an input data stream, partitioning the input data stream into a plurality of data blocks, and compressing the data blocks utilizing a plurality of processor sets. Each processor set is assigned a data block to compress. The processor sets compress in parallel to exploit inter-block parallelism. Each processor set comprises one or more processors that collaborate in compressing an assigned data block to exploit intra-block parallelism. The method further comprises writing a plurality of compressed data blocks resulting from the compressing to a storage device in encoded form.

These and other aspects, features and advantages of the invention will be understood with reference to the drawing figures, and detailed description herein, and will be realized by means of the various elements and combinations particularly pointed out in the appended claims. It is to be understood that both the foregoing general description and the following brief description of the drawings and detailed description of the invention are exemplary and explanatory of preferred embodiments of the invention, and are not restrictive of the invention, as claimed.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

The present invention generally relates to data compression, and more particularly, to a parallel Lempel-Ziv data compression scheme for highly-parallel computer architectures. One embodiment provides a method comprising receiving an input data stream, partitioning the input data stream into a plurality of data blocks, and compressing the data blocks utilizing a plurality of processor sets. Each processor set is assigned a data block to compress. The processor sets compress in parallel to exploit inter-block parallelism. Each processor set comprises one or more processors that collaborate in compressing an assigned data block to exploit intra-block parallelism. The method further comprises writing a plurality of compressed data blocks resulting from the compressing to a storage device in encoded form.

LZ77 compression scheme is a lossless data compression algorithm described in the publication titled "A universal algorithm for sequential data compression" by Abraham Lempel and Jacob Ziv, published in *IEEE Transactions on Information Theory* in 1977. The LZ77 compression scheme is a dictionary encoding technique that achieves data compression by replacing repeated occurrences of data (e.g., a string of symbols) within an input data stream with references to a single copy of that data existing earlier in the input data stream (e.g., a reference to a dictionary location of the same string occurring earlier in the input data stream). During a matching phase of the algorithm, a match is encoded by a pair of numbers denoted as a length-distance pair. The length-distance pair indicates that each of the next length characters is equal to the characters positioned exactly distance characters behind it in the input data stream (i.e., distance is indicative of offset). The Lempel-Ziv-Storer-Szymanski (LZSS) compression scheme is a derivative of LZSS.

Conventionally, to parallelize compression on multi-core systems, an input data stream is divided into multiple data blocks that are processed independently and in parallel. The resulting processed data blocks, however, may be too small, leading to a lower compression ratio as there is less redundancy to exploit within each data block. This conventional solution exploits only inter-block parallelism and is unsuitable for highly-parallel computer architectures such as GPUs, FPGAs, or MPPAs.

For expository purposes, the term "processor" as used herein generally refers to a processor device, a specialized processor device (e.g., an application acceleration processor such as GPUs, FPGAs, etc.), a hardware thread, or a processor core of a multi-core or many-core system.

Figure 1C:
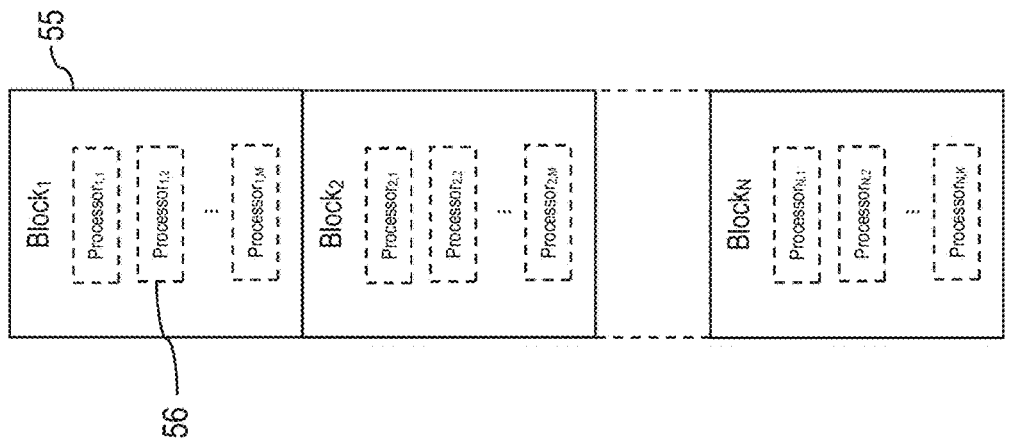
FIG. 1C illustrates an example data compression scheme that exploits both intra-block parallelism and inter-block parallelism, in accordance with an embodiment of the invention.
Figure 1B:
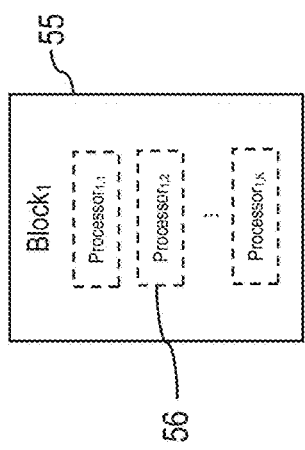
FIG. 1B illustrates an example data compression scheme that exploits only intra-block parallelism.
Figure 1A:
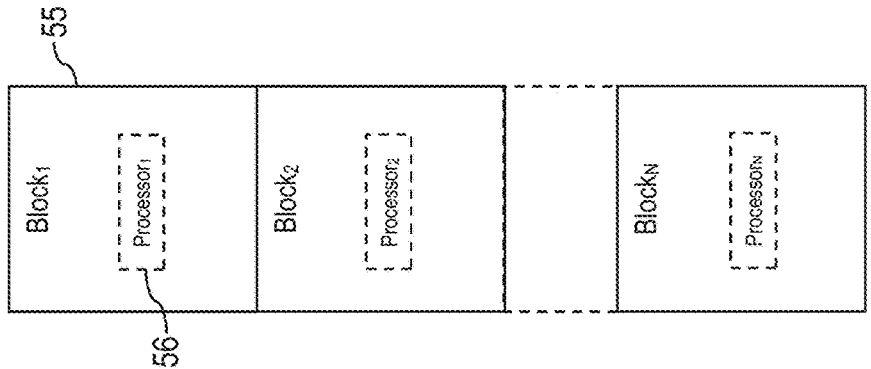
FIG. 1A illustrates an example data compression scheme that exploits only inter-block parallelism.

FIG. 1A illustrates an example data compression scheme that exploits only inter-block parallelism. In inter-block parallelism, multiple data blocks 55 are processed independently and in parallel. Specifically, each data block 55 has a corresponding processor 56 for processing the data block 55 (e.g., $Processor_1$ processing $Block_1$, $Processor_2$ processing $Block_2$, ..., and finally, $Processor_N$ processing $Block_N$).

FIG. 1B illustrates an example data compression scheme that exploits only intra-block parallelism. In intra-block parallelism, multiple processors 56 cooperatively process a data block 55 in parallel (e.g., $Processor_{1,1}$, $Processor_{1,2}$, ..., $Processor_{1,K}$ cooperatively processing $Block_1$).

FIG. 1C illustrates an example data compression scheme that exploits both intra-block parallelism and inter-block parallelism, in accordance with an embodiment of the invention. In one embodiment, multiple data blocks 55 are processed independently and in parallel. Specifically, collaborating groups of processors are assigned to work on the same data block 55. Each data block 55 has a corresponding set of processors 56 that cooperatively process the data block 55 in parallel (e.g., $Processor_{1,1}$, $Processor_{1,2}$, ..., $Processor_{1,M}$ cooperatively processing $Block_1$, whereas $Processor_{2,1}$, $Processor_{2,2}$, ..., $Processor_{2,M}$ cooperatively processing $Block_2$, ..., and finally, $Processor_{N,1}$, $Processor_{N,2}$, ..., $Processor_{N,M}$ cooperatively processing $Block_N$).

One embodiment utilizes brute force matching to exploit parallelism in presence of a large number (e.g., hundreds to thousands) of cores. Brute force matching may be implemented with low complexity. Another embodiment utilizes minimal comparison matching to reduce or minimize a number of string comparisons during a Lempel-Ziv matching phase.

Figure 2:
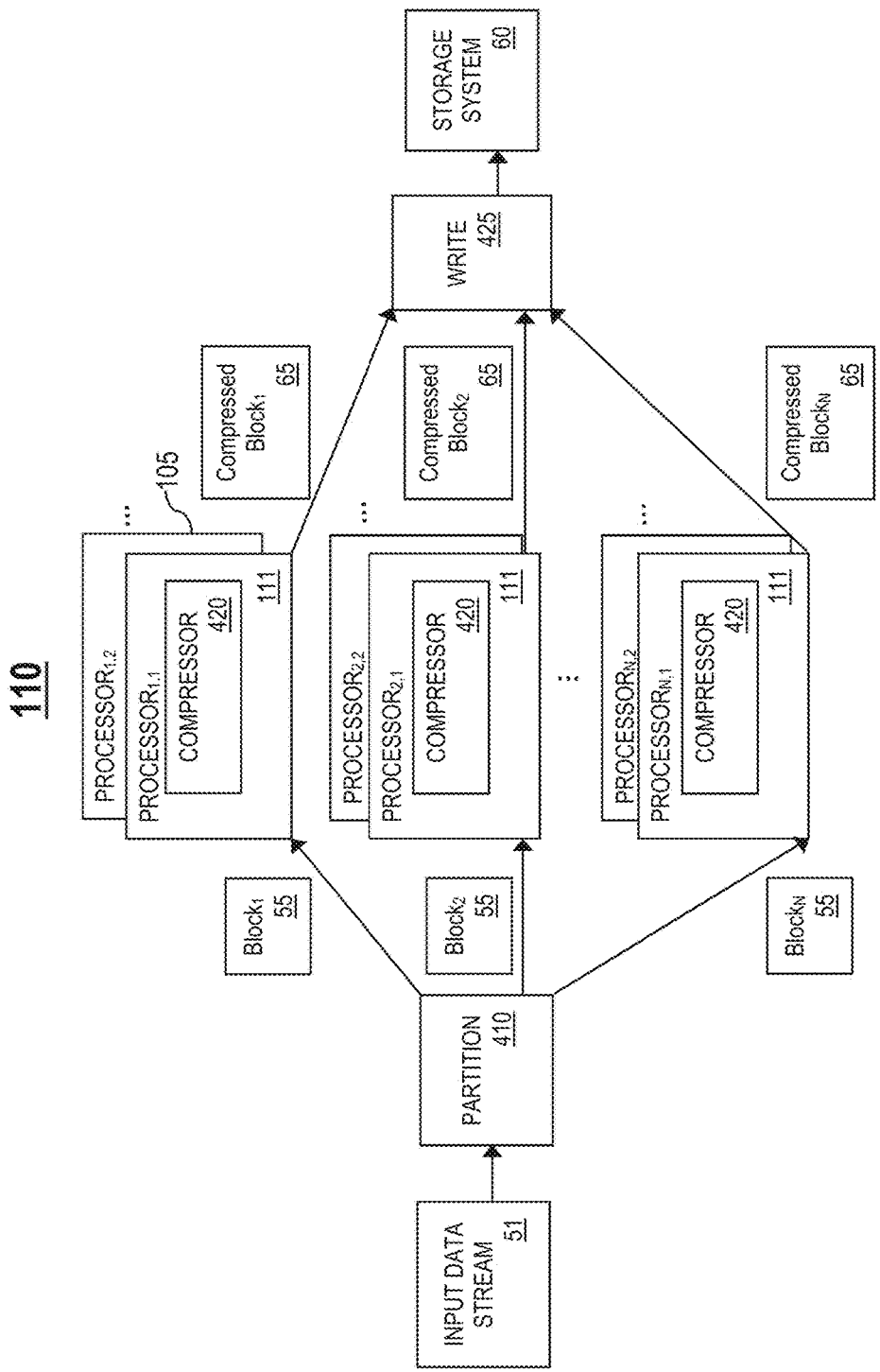
FIG. 2 illustrates an example highly-parallel compression system, in accordance with an embodiment of the invention.

FIG. 2 illustrates an example highly-parallel compression system 110, in accordance with an embodiment of the invention. As described in detail later herein, the compression system 110 implements a parallel Lempel-Ziv data compression scheme utilizing multiple different processor sets 105, wherein each processor set 105 comprises one or more processors 111.

The compression system 110 further comprises a partition unit 410 configured to: (1) receive an input data stream 51, (2) partition/divide the input data stream 51 into a plurality of N data blocks 55 (e.g., $Block_1$, $Block_2$, ..., $Block_N$), wherein N>1, and (3) dispatch each data block 55 to one of the processor sets 105.

The data blocks 55 are compressed independently and in parallel. Each data block 55 is assigned a corresponding processor set 105.

The compression system 110 exploits both intra-block parallelism and inter-block parallelism during parallel compression. To exploit inter-block parallelism, the different processor sets 105 compress different data blocks in parallel. To exploit intra-block parallelism, processors 111 of each processor set 105 collaborate in compressing a given data block.

In one embodiment, the compression system 110 further comprises multiple compressors 420 that operate in parallel (i.e., run concurrently). Each processor set 105 utilizes a compressor 420 to compress a given data block. In one embodiment, the compressors 420 are assigned to different processor sets 105. In another embodiment, each compressor 420 is instantiated separately in silicon. Each compressor 420 uses parallelism (e.g., thread parallelism by having multiple processors 111 or hardware threads collaborating on compression of a data block, or using pipeline parallelism and task parallelism for an embodiment in silicon or an FPGA).

For example, as shown in FIG. 2, $Processor_{1,1}$, $Processor_{1,2}$, ... cooperatively compress $Block_1$, whereas $Processor_{2,1}$, $Processor_{2,2}$, ... cooperatively compress $Block_2$, ..., and finally, $Processor_{N,1}$, $Processor_{N,2}$, ... cooperatively compress $Block_N$. Each $Processor_{a,b}$ does not necessarily have be a physical processor. Instead, each $Processor_{a,b}$ may be a logical execution context running on the same physical processor a. For example, in a software-implementation on a CPU, each $Processor_{a,b}$ is a logical processor (e.g., using Intel's HyperThreading or simultaneous multi-threading on IBM POWER) whose threads run concurrently on hardware-resources of physical processor a. As another example, in in a GPU implementation, each $Processor_{a,b}$ is a thread (e.g., a logical entity executed on a CUDA core).

The compression system 110 further comprises a write unit 425 configured to: (1) receive resulting compressed data blocks 65 (e.g., $CompressedBlock_1$, $CompressedBlock_2$, ..., $CompressedBlock_N$) from the compressors 420, (2) assemble the compressed data blocks 65 that arrive out of order (as some later dispatched data blocks 55 may be faster to compress than some earlier dispatched data blocks 55), and (3) write the compressed data blocks 65 to a storage system 60 in encoded form. In one embodiment, the write unit 425 encodes the compressed data blocks 65 utilizing a Huffman, an arithmetic, or a range entropy encoder.

The storage system 60 exchanges data with the compression system 110 over a connection (e.g., a wireless connection, a wired connection, or a combination of the two). The storage system 60 may comprise a single persistent storage device or a distribution of persistent storage devices.

Figure 3:
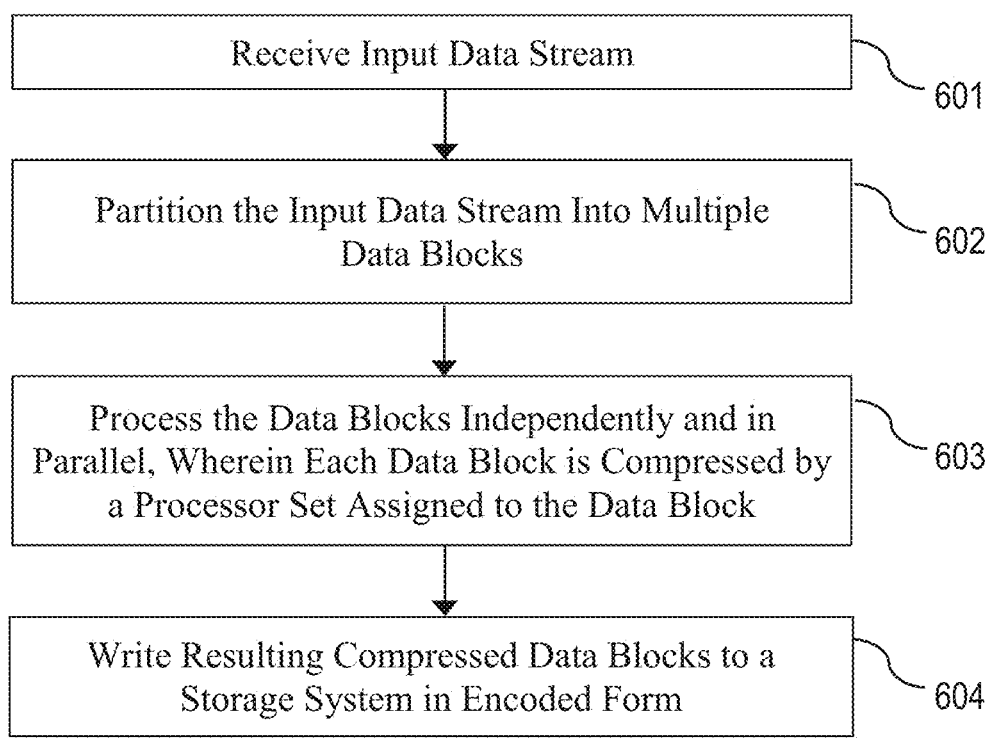
FIG. 3 illustrates a flowchart of an example process for parallel compression performed by the compression system, in accordance with an embodiment of the invention.

FIG. 3 illustrates a flowchart of an example process 600 for parallel compression performed by the compression system 110, in accordance with an embodiment of the invention. In process block 601, receive an input data stream. In process block 602, partition the input data stream into a plurality of data blocks. In process block 603, process the data blocks independently and in parallel, wherein each data block is compressed by a corresponding processor set assigned to the data block. In process block 604, write resulting compressed data blocks to a storage system in encoded form.

In one embodiment, process blocks 601-604 may be performed by the compression system 110 utilizing the partition unit 410, the processor sets 105, the compressors 420, and the write unit 425.

Figure 4:
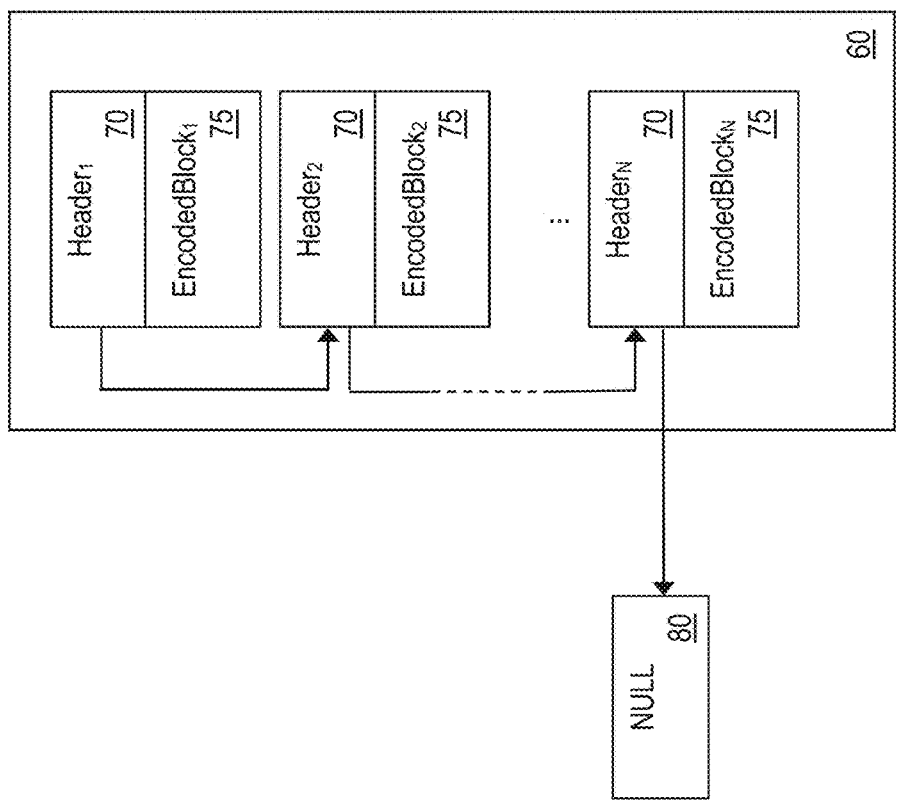
FIG. 4 illustrates an example arrangement of encoded and compressed data blocks written to a storage system, in accordance with an embodiment of the invention.

FIG. 4 illustrates an example arrangement of encoded and compressed data blocks 75 written to the storage system 60, in accordance with an embodiment of the invention. The write unit 425 encodes compressed data blocks 65 (e.g., using a Huffman, an arithmetic, or a range entropy encoder) and writes resulting encoded and compressed data blocks 75 to the storage system 60.

In one embodiment, the data blocks 75 are laid out in the storage system 60 in an arrangement/sequence where each data block 75 is preceded by a corresponding block header 70. A block header 70 comprises information indicative of a file offset (in bytes) to either another block header 70 (i.e., start of subsequent data block 75) or the value NULL 80 if there are no more data blocks in this arrangement/sequence.

For example, as shown in FIG. 4, a first data block 75 (EncodedBlock$_1$) has a first block header 70 (Headers), a second data block 75 (EncodedBlock$_2$) has a second block header 70 (Header$_2$), . . . , and a N$^{th}$ data block 75 (EncodedBlock$_N$) has a N$^{th}$ block header 70 (Header$_N$). The first block header 70 (Header$_1$) references/points to the second block header 70 (Header$_2$). As the N$^{th}$ data block 75 (EncodedBlock$_N$) is the last data block 75 of the arrangement/sequence, the N$^{th}$ block header 70 (Header$_N$) is set to the NULL value 80.

In one embodiment, except for the last data block 75 of the arrangement/sequence, the data blocks 75 are equal-sized (i.e., have the same size).

Figure 5:
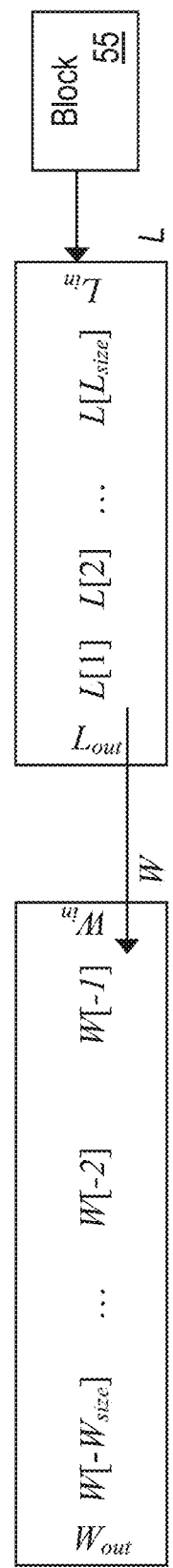
FIG. 5 illustrates an example lookahead buffer and an example window, in accordance with an embodiment of the invention.

FIG. 5 illustrates an example lookahead buffer and an example window, in accordance with an embodiment of the invention. Let L denote a lookahead buffer for maintaining a sequence of unprocessed elements (i.e., characters or bytes) of a data block, let L[1] denote a head element of the lookahead buffer L (i.e., the first/next unprocessed to process), and let $L_{size}$ denote a pre-determined size for the lookahead buffer L (i.e., the lookahead buffer L can store up to $L_{size}$ elements). The lookahead buffer L has a first side $L_{in}$ (e.g., a right side) through which one or more unprocessed elements are inserted into the lookahead buffer L, and a second side $L_{out}$ (e.g., a left side) through which one or more elements are shifted out of the lookahead buffer L after the elements have been processed. Let W denote a dictionary maintaining a sequence of processed elements (i.e., characters or bytes) of a data block, let W[−1] denote a most recent processed element (i.e., the element most recently inserted into the window W), let W[−$W_{size}$] denote an oldest processed element (i.e., the element that has been in the window W the longest), and let $W_{size}$ denote a pre-determined size for the window W (i.e., the window W can store up to $W_{size}$ elements). The window W has a first side $W_{in}$ (e.g., a right side) through which one or more processed elements are inserted into the window W, and a second side $W_{out}$ (e.g., a left side) through which one or more elements are shifted out of the window W when the window W is full to accommodate one or more most recently processed elements.

In one embodiment, a compressor 420 is configured to factorize a string (e.g., a string of characters or bytes included in a given data block) into a sequence of tokens. Each token may be either a literal token x or a back-reference token (o, l), wherein the literal token x represents a particular character or byte of the string, and wherein the back-reference token (o, l) represents a sub-string that starts at the o$^{th}$ character or byte of the string and includes the next l characters or bytes of the string.

A compressor 420 maintains, for a given data block 55, a corresponding lookahead buffer L and a corresponding window W. The lookahead buffer L maintains the $L_{size}$ unprocessed elements for a processor set 105 assigned to the data block 55 to process (i.e., next elements of the data block 55 to process). The window W maintains a sequence of processed elements that the processor set 105 has already processed (i.e., previously processed elements of the data block 55). The compression of the data block 55 includes a matching phase during which the processor set 105 applies a parallel matching algorithm to find a match. Specifically, the processor set 105 searches for a longest subsequence within the sequence of processed elements of the window W that equals the sequence of unprocessed elements of the lookahead buffer L. Any match found must comprise a subsequence that begins/starts with a character/byte that is equal to the head element L[−1] of the lookahead buffer L.

After the matching phase, a processor 111 from the processor set 105 is singled out. As described in detail later herein, the processors 111 collectively determine the best match (i.e., the longest match) among the individual best matches that each processor 111 identified separately.

Let l denote a minimal length. The processor 111 identified as having found the longest match of length l is singled out to emit a back-reference token (o, l). Back-reference tokens having length l<l are suppressed. If no match has been found or the length l of the best match is smaller than the minimal length l, one of the processors 111 is singled out (randomly or statically) to emit the head element of the lookahead buffer L[−1] as a literal token x.

One or more elements of the lookahead buffer L processed by the singled out processor 111 during the matching phase are shifted out of the second side $L_{out}$ of the lookahead buffer L and inserted into the first side $W_{in}$ of the window W as one or more most recently processed elements. If the window W is full, one or more oldest processed elements of the window W may be shifted out of the second side $W_{out}$ of the window W to accommodate the one or more most recently processed elements.

For example, if the singled out processor 111 emits a back-reference token (o, l), the next l elements of the lookahead buffer L are shifted out of the lookahead buffer L and into the window W. If the window W is full, the l oldest elements in the window W are shifted out of the window W to accommodate the next l elements of the lookahead buffer L. If a literal token x is emitted, only the head element L[1] of the lookahead buffer L is shifted out of the lookahead buffer L and into the window W. If there are one or more additional unprocessed elements (i.e., either in the lookahead buffer L or a remaining portion of the data block 55 that has not yet been inserted into the lookahead buffer L), the matching phase is repeated. Any remaining portion of the data block 55 that has not yet been processed is inserted into the lookahead buffer L for processing.

Figure 6:
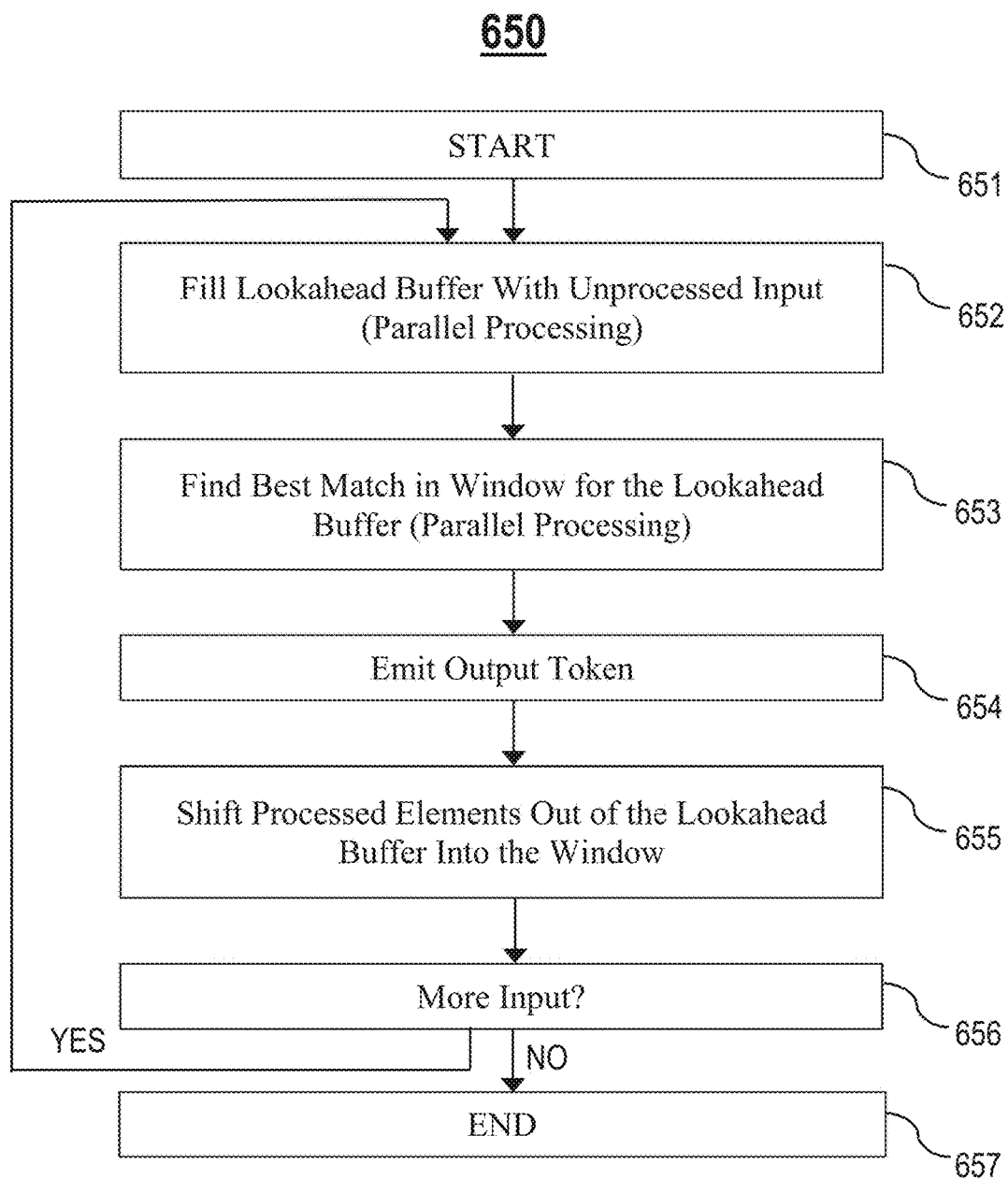
FIG. 6 illustrates a flowchart of an example process for parallel compression performed by the compression system, in accordance with an embodiment of the invention.

FIG. 6 illustrates a flowchart of an example process 650 for parallel compression performed by the compression system 110, in accordance with an embodiment of the invention. In process block 651, process 650 starts. Process blocks 652 and 653 involve parallel processing. Specifically, in process block 652, each processor of a processor set fills a lookahead buffer with unprocessed input from a given data block. In process block 653, each processor of the processor set finds a best match in a window for the unprocessed input in the lookahead buffer.

In process block 654, one processor of the processor set is singled out (e.g., the processor identified as having found the longest match) to emit an output token (i.e., a literal token or a back-reference token) indicative of the best match found, if any. In process block 655, the singled out processor shifts one or more processed elements out of the lookahead buffer into the window. In process block 656, the singled out processor determines whether there is any more unprocessed input from the data block. If there is remaining unprocessed input from the data block, return to process block 652. If there is no more remaining unprocessed input from the data block, proceed to process block 657 where process 650 ends.

In one embodiment, process blocks 651-657 may be performed by the compression system 110 utilizing a processor set 105 and a compressor 420.

In one embodiment, the parallel matching algorithm applied by a processor set 105 is brute force matching.

Figure 7:
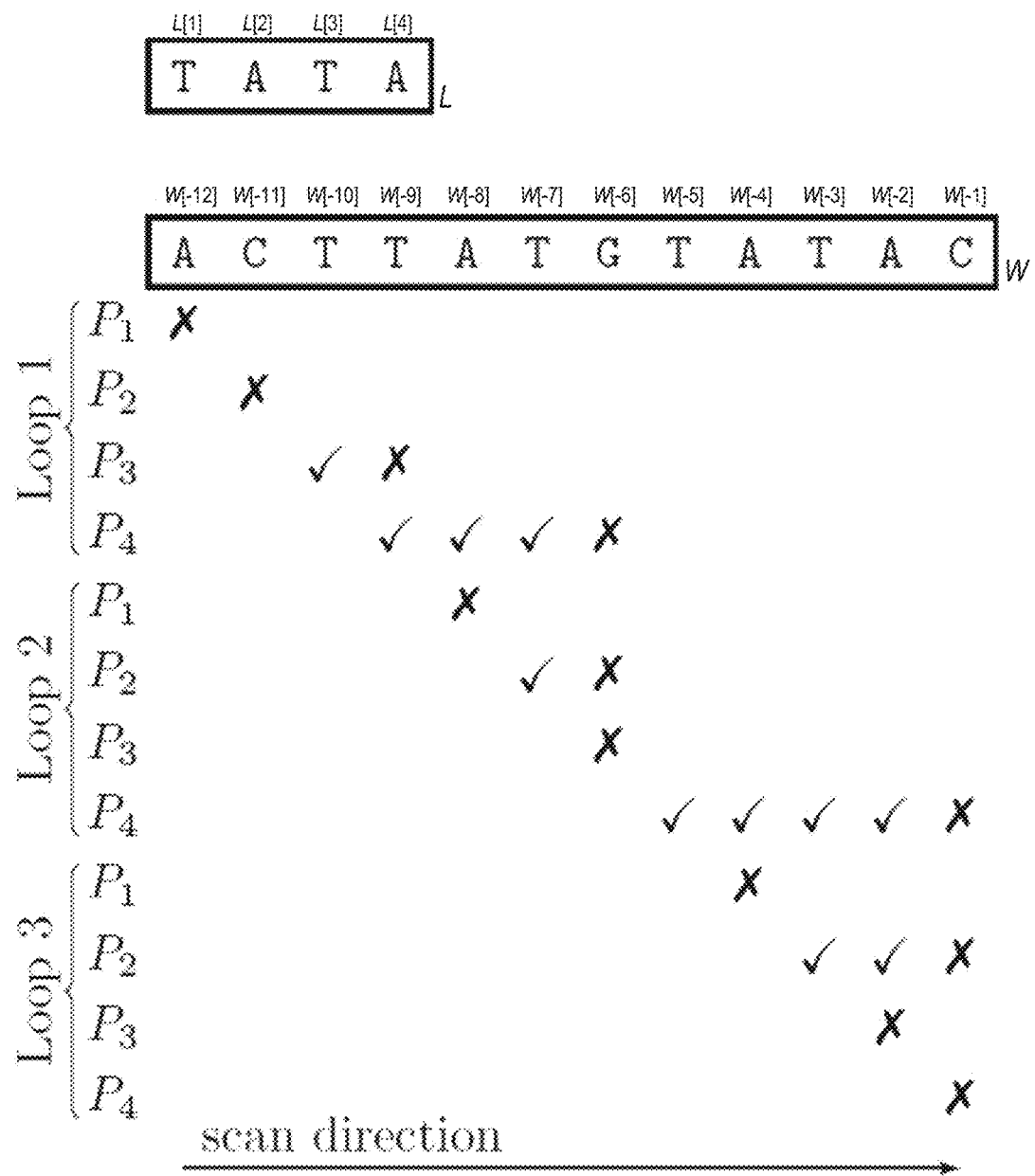
FIG. 7 illustrates an example implementation of brute force matching, in accordance with an embodiment of the invention.

FIG. 7 illustrates an example implementation of brute force matching, in accordance with an embodiment of the invention. During the matching phase, a processor set 105 applies brute force matching to a given data block 55 to find a best match in a corresponding window W by matching one or more subsequences within a sequence of processed elements of the window W with a sequence of unprocessed elements of the lookahead buffer L. Brute force matching operates at an overall complexity $O(W_{size}^2)$.

Let P denote a processor set 105 assigned to a data block 55, let $P_{num}$ denote a number of processors 111 included in the set P, and let $P_i$ denote a processor 111 of the set P, wherein $P_{num} \geq 1$, and $P = \{P_1, \ldots, P_{num}\}$. For a data block 55, execution of brute force matching may be distributed over processors $P_1, \ldots, P_{num}$ of the set P assigned to the data block 55, such that the brute force matching may be performed in $O(W_{size}^2 / P_{num})$ time.

For example, if $W_{size} = 12$ (i.e., the window W is a 12-element window), the window W maintains a sequence of processed elements $W[-1], \ldots, W[-12]$. If $L_{size} = 4$ (i.e., the lookahead buffer L is a 4-element window), the lookahead buffer L maintains a sequence of unprocessed elements $L[1], \ldots, L[4]$. If $P_{num} = 4$ (i.e., the number of processors 111 assigned to the data block 55 is 4), the set P comprises processors $P_1$, $P_2$, $P_3$, and $P_4$.

As shown in FIG. 7, the window W comprises processed elements A, C, T, T, A, T, G, T, A, T, A, C, wherein $W[-1] = C$, and wherein $W[-12] = A$. The lookahead buffer L comprises processed elements T, A, T, A, wherein a head element $L[1] = T$.

The processors $P_1$, $P_2$, $P_3$, and $P_4$ scan the window W in parallel along a scan direction (e.g., from the second side $W_{out}$ to the first side $W_{in}$). The processors $P_1$, $P_2$, $P_3$, and $P_4$ initiate a scan of the window W at different start positions of the window W. Let $o_1$, $o_2$, $o_3$, and $o_4$ denote start positions for the processors $P_1$, $P_2$, $P_3$, and $P_4$, respectively.

During the matching phase, each processor $P_i$ initiates a scan of the window W with a first comparison loop (e.g., Loop 1). During the first comparison loop, the processor $P_i$ compares an element $W[o_i]$ located at start position $o_i$ of the window W against the head element $L[1]$ of the lookahead buffer L. If a match occurs (i.e., $W[o_i] = L[1]$), the processor $P_i$ advances sequentially through the window W, comparing a next element of the window W against a next element of the lookahead buffer L (e.g., comparing $W[o_i + 1]$ against $L[2]$, comparing $W[o_i + 2]$ against $L[3]$, etc.) until a mismatch occurs. If a mismatch occurs (i.e., $W[o_i] \neq L[1]$), the processor $P_i$ exits the first comparison loop and waits for one or more other processors of the set P to exit the first comparison loop.

As shown in FIG. 7, at the start of the first comparison loop, $o_1 = -12$, $o_2 = -11$, $o_3 = -10$, and $o_4 = -9$. During the first comparison loop, the processor $P_1$ compares element $W[-12]$ against the head element $L[1]$ and encounters a mismatch. In response to encountering the mismatch, the processor $P_1$ exits the first comparison loop.

During the first comparison loop, the processor $P_2$ compares element $W[-11]$ against the head element $L[1]$ and encounters a mismatch. In response to encountering the mismatch, the processor $P_2$ exits the first comparison loop.

During the first comparison loop, the processor $P_3$ compares element $W[-10]$ against the head element $L[1]$ and encounters a first match. In response to encountering the first match, the processor $P_3$ advances to a next element $W[-9]$ of the window W, compares the next element $W[-9]$ against a next element $L[2]$ of the lookahead buffer L, and encounters a mismatch. In response to encountering the mismatch, the processor $P_3$ exits the first comparison loop.

During the first comparison loop, the processor $P_4$ compares element $W[-9]$ against the head element $L[1]$ and encounters a first match. In response to encountering the first match, the processor $P_4$ advances to a next element $W[-8]$ of the window W, compares the next element $W[-8]$ against a next element $L[2]$ of the lookahead buffer L, and encounters a second match. In response to encountering the second match, the processor $P_4$ advances to a next element $W[-7]$ of the window W, compares the next element $W[-7]$ against a next element $L[3]$ of the lookahead buffer L, and encounters a third match. In response to encountering the third match, the processor $P_4$ advances to a next element $W[-6]$ of the window W, compares the next element $W[-6]$ against a next element $L[4]$ of the lookahead buffer L, and encounters a mismatch. In response to encountering the mismatch, the processor $P_4$ exits the first comparison loop.

The scan of the window W continues with a second comparison loop (e.g., Loop 2) that begins only after each processor $P_i$ has exited the first comparison loop. As shown in FIG. 7, at the start of the second comparison loop, $o_1 = -8$, $o_2 = -7$, $o_3 = -6$, and $o_4 = -5$. During the second comparison loop, the processor $P_1$ compares element $W[-8]$ against the head element $L[1]$ and encounters a mismatch. In response to encountering the mismatch, the processor $P_1$ exits the second comparison loop.

During the second comparison loop, the processor $P_2$ compares element $W[-7]$ against the head element $L[1]$ and encounters a first match. In response to encountering the first match, the processor $P_2$ advances to a next element $W[-6]$ of the window W, compares the next element $W[-6]$ against a next element $L[2]$ of the lookahead buffer L, and encounters a mismatch. In response to encountering the mismatch, the processor $P_2$ exits the second comparison loop.

During the second comparison loop, the processor $P_3$ compares element $W[-6]$ against the head element $L[1]$ and encounters a mismatch. In response to encountering the mismatch, the processor $P_3$ exits the second comparison loop.

During the second comparison loop, the processor $P_4$ compares element $W[-5]$ against the head element $L[1]$ and encounters a first match. In response to encountering the first match, the processor $P_4$ advances to a next element $W[-4]$ of the window W, compares the next element $W[-4]$ against a next element $L[2]$ of the lookahead buffer L, and encounters a second match. In response to encountering the second match, the processor $P_4$ advances to a next element $W[-3]$ of the window W, compares the next element $W[-3]$ against a next element $L[3]$ of the lookahead buffer L, and encounters a third match. In response to encountering the third match, the processor $P_4$ advances to a next element W[-2] of the window W, compares the next element W[-2] against a next element L[4] of the lookahead buffer L, and encounters a fourth match. Since L[4] is the last element in the lookahead buffer L, the processor $P_4$ stops its matching process with a found match length of l=4 as there is no more next element to compare against.

The scan of the window W continues with a third comparison loop (e.g., Loop 3) that begins only after each processor $P_i$ has exited the second comparison loop.

As shown in FIG. 7, at the start of the third comparison loop, $o_1=-4$, $o_2=-3$, $o_3=-2$, and $o_4=-1$. During the third comparison loop, the processor $P_1$ compares element W[-4] against the head element L[1] and encounters a mismatch. In response to encountering the mismatch, the processor $P_1$ exits the third comparison loop.

During the third comparison loop, the processor $P_2$ compares element W[-3] against the head element L[1] and encounters a first match. In response to encountering the first match, the processor $P_2$ advances to a next element W[-2] of the window W, compares the next element W[-2] against a next element L[2] of the lookahead buffer L, and encounters a second match. In response to encountering the second match, the processor $P_2$ advances to a next element W[-1] of the window W, compares the next element W[-1] against a next element L[3] of the lookahead buffer L, and encounters a mismatch. In response to encountering the mismatch, the processor $P_2$ exits the third comparison loop.

During the third comparison loop, the processor $P_3$ compares element W[-2] against the head element L[1] and encounters a mismatch. In response to encountering the mismatch, the processor $P_3$ exits the third comparison loop.

During the third comparison loop, the processor $P_4$ compares element W[-1] against the head element L[1] and encounters a mismatch. In response to encountering the mismatch, the processor $P_4$ exits the third comparison loop.

At the end of the third comparison loop, the processors $P_1$, $P_2$, $P_3$, and $P_4$ have scanned the entire window W. Table 1 below provides a summary of the matches found during the scan of the window W.

TABLE 1

$P_1$: Ø
$P_2$: {(-7, 1), (-3, 2)}
$P_3$: {(-10, 1)}
$P_4$: {(-9, 3), (-5, 4)}

As shown in Table 1, during the scan of window W, processor $P_1$ found no matching substrings, processor $P_2$ found two matching substrings, processor $P_3$ found one matching substring, and processor $P_4$ found two matching substrings.

While traversing the window W, each processor $P_i$ remembers the longest matching substring it has individually identified so far. Table 2 below identifies the longest matching substring found by each processor $P_i$ during the scan of the window W.

TABLE 2

$P_1$: Ø
$P_2$: (-3, 2)
$P_3$: (-10, 1)
$P_4$: (-5, 4)

If there is a tie between two matching substrings (o, l) and (o', l) with the same length l, the matching substring with the shortest back-reference wins the tie (i.e., the matching substring with a start position referencing a more recent element of the window W). For example, if o>o', matching substring (o, l) wins the tie. This tie-breaking rule facilitates a shorter bit encoding the back-reference when writing resulting compressed data blocks to the storage system 60.

The processors $P_1$, $P_2$, $P_3$, and $P_4$ collectively determine the best match ($o_{best}$, $l_{best}$) among all the processors $P_1$, $P_2$, $P_3$, and $P_4$ (i.e., longest matching substring among all the individual longest matching substrings each processor $P_i$ has separately identified). In one embodiment, the best match ($o_{best}$, $l_{best}$) among a set of processors $P_1$, ..., $P_{num}$, is determined in accordance with equation (1) provided below:

$$(o_{best}, l_{best}) = \text{best}((o_1, l_1), \ldots, (o_{num}, l_{num})) \qquad (1),$$

wherein $(o_1, l_1), \ldots, (o_{num}, l_{num})$ denotes a longest matching substring separately identified by processors $P_1, \ldots, P_{num}$, respectively.

In one embodiment, a distributed consensus system may be used to determine the best match. Shared memory and inter-process communication primitives may be used in a multi-core or shared-memory processor system. Hardware-synchronization mechanisms such as GPU warp-synchronization instructions in GPUs may also be used to efficiently determine the best match.

The processor $P_i$ identified as having found the best match ($o_{best}$, $l_{best}$) is singled out to emit a back-reference token (o, l). If no match has been found or the length l of the best match is smaller than the minimal length l, one of the processors $P_1, \ldots, P_{num}$ singled out (deterministically or randomly) to emit the head element of the lookahead buffer L[-1] as a literal token x.

The window W and the lookahead buffer L are updated based on the emitted token. Specifically, the emitted back-reference token (o, l) or the emitted literal token x is inserted into the window W through the first side $W_{in}$, and one or more remaining elements of the window W are shifted towards the second side $W_{out}$ to accommodate the insertion, wherein l<$L_{size}$. The lookahead buffer L is filled up with l or $L_{size}$ elements from a remaining portion of the data block 55 that has yet to be processed. The processors $P_1, \ldots, P_{num}$ repeat brute force matching in parallel until the entire data block 55 has been processed.

Figure 8:
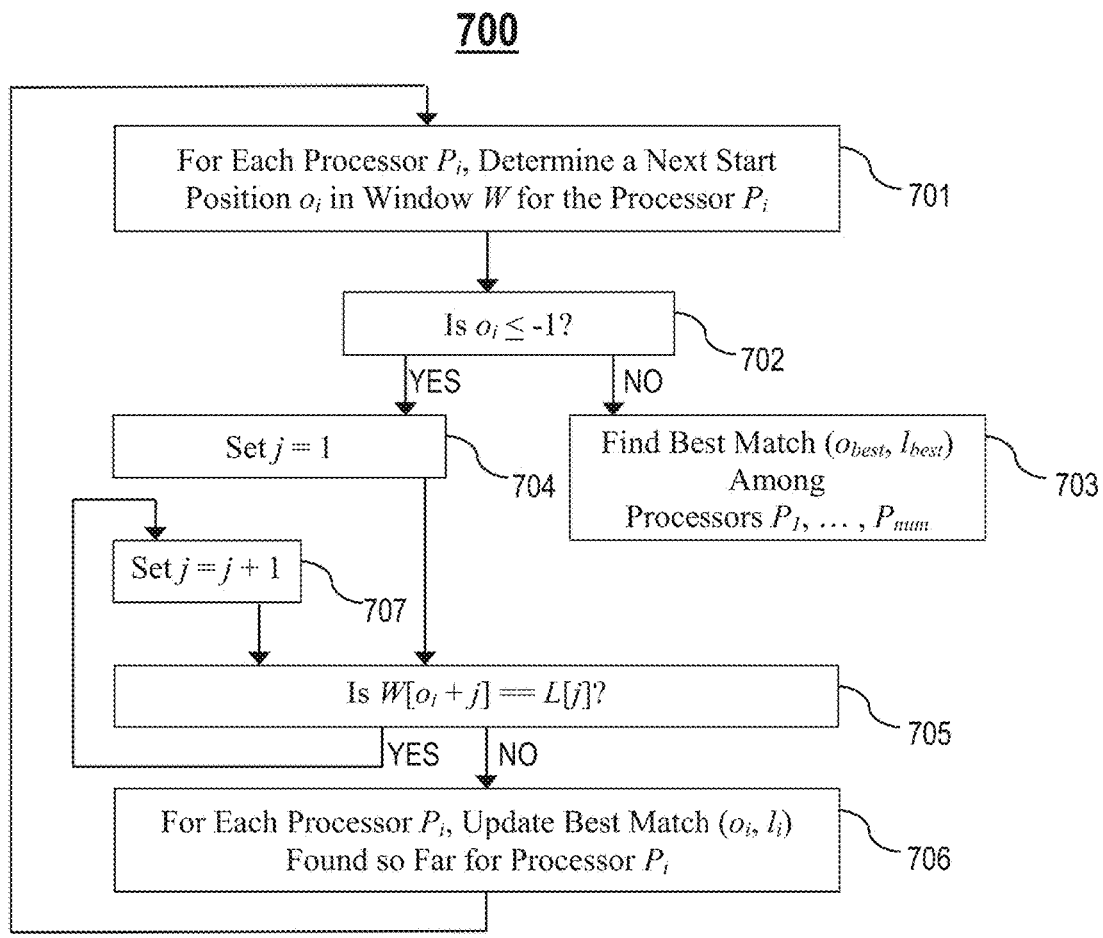
FIG. 8 illustrates a flowchart of an example process for brute force matching performed by a processor set, in accordance with an embodiment of the invention.

FIG. 8 illustrates a flowchart of an example process 700 for brute force matching performed by a processor set, in accordance with an embodiment of the invention. In process block 701, determine, for each processor $P_i$ of a processor set P assigned to a data block, a corresponding start position $o_i$ in window W for the processor $P_i$. In process block 702, determine, for each processor $P_i$, whether a corresponding start position $o_i$ is less than or equal to -1 (i.e., whether the corresponding start position $o_i$ references one of elements W[-$W_{size}$], ..., W[-1] of the window W). If the corresponding start position $o_i$ is greater than -1 (i.e., the corresponding start position $o_i$ does not reference an element of the window W), proceed to process block 703. In process block 703, find the best match ($o_{best}$, $l_{best}$) among the processors $P_1, \ldots, P_{num}$ of the processor set P.

If the corresponding start position $o_i$ is less than or equal to -1, proceed to process block 704. In process block 704, initialize an index j for a lookahead buffer L (e.g., set the index j=1). In process block 705, determine whether a next element W[$o_i$+j] of the window W matches a next element L[j] of the lookahead buffer L (i.e., whether W[$o_i$+j-1]==L[j]). If the element W[$o_i$+j] of the window W does not match the next element L[j] of the lookahead buffer L (i.e., there is a mismatch), proceed to process block 706. In process block 706, update, for each processor $P_i$, a corresponding best match $(o_i, l_i)$ found so far for the processor $P_i$.

If the next element $W[o_i+j-1]$ of the window W matches the next element $L[j]$ of the lookahead buffer L, proceed to process block 707. In process block 707, increment the index j, and return to process block 705.

In one embodiment, process blocks 701-707 may be performed by the compression system 110 utilizing a processor set 105 and a compressor 420.

Utilizing brute force matching may result in a computation overhead. For example, after shifting one or more elements of the window W, some future comparisons may be repeated unnecessarily, resulting in complexity of $O(W_{size}^2)$ comparisons.

In one embodiment, the parallel matching algorithm applied by a processor set 105 is minimal comparison matching to reduce or minimize the number of comparisons performed during the matching phase.

Figure 9A:
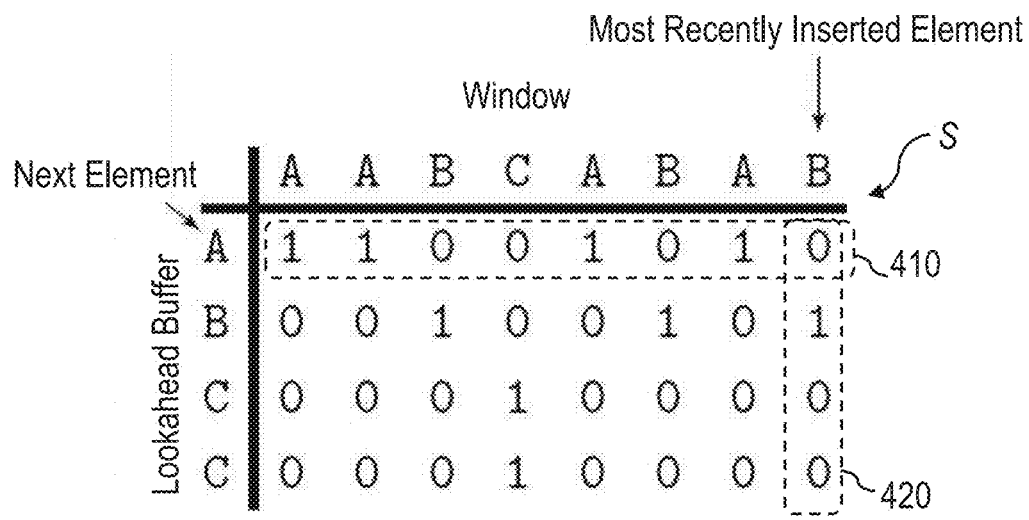
FIG. 9A illustrates an example in which the results of the comparisons between elements of the window and the lookahead buffer are represented as a matrix, in accordance with one embodiment.

FIGS. 9A-9E illustrate an example implementation of minimal comparison matching, in accordance with an embodiment of the invention. Specifically, FIG. 9A illustrates an example in which the results of the comparisons between elements of the window W and the lookahead buffer L are represented as a matrix, in accordance with one embodiment. Let S denote a $L_{size} \times W_{size}$ matrix comprising a plurality of Boolean values (i.e., bits) for a plurality of comparisons between elements of the window W and the lookahead buffer L. In one embodiment, each row 410 of the matrix S corresponds to an unprocessed element of the lookahead buffer L, and each column 420 of the matrix S corresponds to a processed element of the window W. Let $S_{r,c}$ denote an entry of the matrix S, wherein $1 \leq r \leq L_{size}$, and $1 \leq c \leq W_{size}$. Each entry $S_{r,c}$ comprises a Boolean value indicative of a result of a comparison between an element $W[c-W_{size}-1]$ of the window W and an element $L[r]$ of the lookahead buffer L. Entries for comparisons involving element $W[-1]$ (i.e., the most recently inserted element of the window W) are included in a last column of the matrix S (i.e., entries $S_{1,Wsize}, \ldots, S_{Lsize, Wsize}$). Entries for comparisons involving element $L[-1]$ (i.e., the head element of the lookahead buffer L) are included in a first/top row of the matrix S (i.e., entries $S_{1,1}, \ldots, S_{1, Wsize}$). For example, as shown in FIG. 9A, entry $S_{1,1}$ comprises a Boolean value indicative of a result of a comparison between $W[-W_{size}]$ and $L[1]$ (i.e., whether $W[-W_{size}]=L[1]$).

Figure 9B:
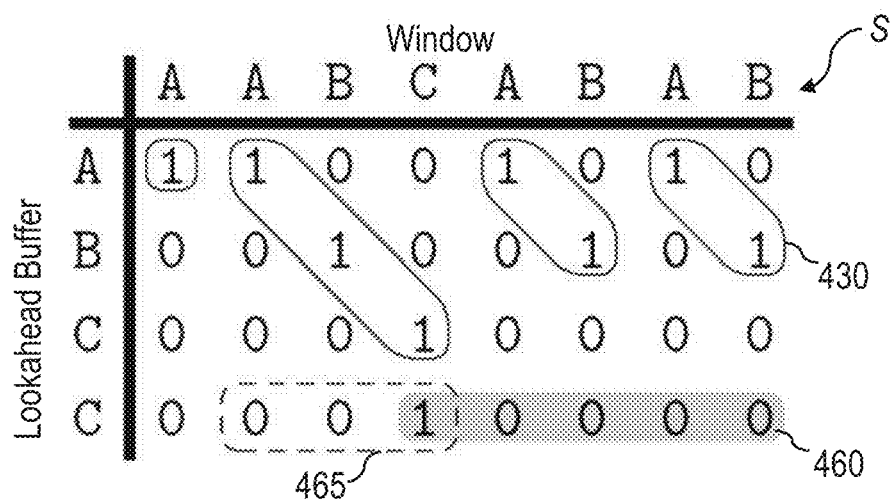
FIG. 9B illustrates the example matrix with matches highlighted, in accordance with one embodiment.

FIG. 9B illustrates the example matrix S with matches highlighted, in accordance with one embodiment. Assume a Boolean value of 1 indicates a match has been encountered. Each processor P of a processor set P searches for a longest matching substring by identifying one or more sequences 430 of ones positioned along one or more diagonals of the matrix S, wherein each diagonal begins at the first/top row of the matrix S, each diagonal corresponds to a specific start position in the window W, and each sequence 430 identified must begin at the first/top row of the matrix S at a specific column that corresponds to a specific start position in the window W that a diagonal the sequence 430 is positioned along corresponds to.

For example, as shown in FIG. 9B, the longest sequence 430 found is a substring "ABC" of length 3 (i.e., the longest sequence comprises entries $S_{1,2}$, $S_{2,3}$, and $S_{3,4}$).

Figure 9C:
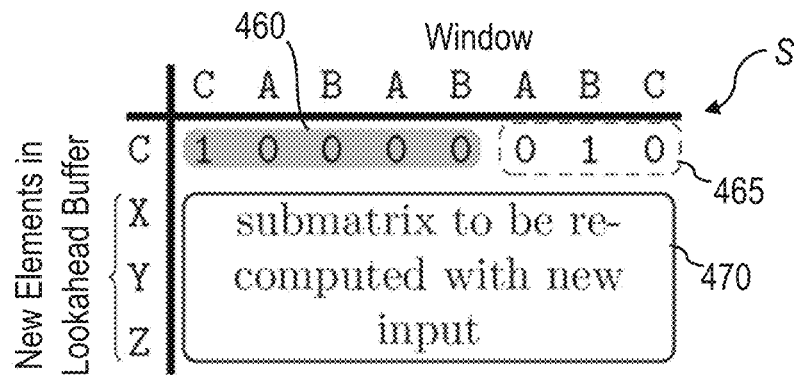
FIG. 9C illustrates the example matrix that has been updated to reflect one or more elements shifted out of the lookahead buffer and into the window, in accordance with one embodiment.

FIG. 9C illustrates the example matrix S that has been updated to reflect one or more elements shifted out of the lookahead buffer L and into the window W, in accordance with one embodiment. After identifying the longest matching substring "ABC", the lookahead buffer L and the window W are updated by shifting the substring "ABC" (i.e., elements L[1], L[2], and L[3]) out of the lookahead buffer L and inserting the substring "ABC" into the window W. The matrix S is updated to reflect the updates to the lookahead buffer L and the window W.

For expository purposes, in this specification, a shift-left operation represents an operation involving shifting entries of the matrix S to the left by the same number of columns as the length of the longest matching substring to reflect the shifting of the substring into the window W (e.g., for the longest matching substring "ABC", shifting entries of the matrix S to the left by three columns). Further, a shift-up operation represents an operation involving shifting entries of the matrix S up by the same number of rows as the length of the longest matching substring to reflect the shifting of the substring out of the lookahead buffer L (e.g., for the longest matching substring "ABC", shifting entries of the matrix S up by three rows).

As shown in FIGS. 9B and 9C, a submatrix 460 (illustrated by a shaded area) identifies same content of the matrix S before and after shift operations. In one embodiment, the shift-left operation and the shift-up operation may be combined into a single upper-left-shift operation in which the submatrix 460 is shifted up along a first diagonal $k_1$ (FIG. 10) of the matrix S by the same number of elements as the length of the longest matching substring to reflect the shifting of the substring out of the lookahead buffer L and into the window W (e.g., for the longest matching substring "ABC", shifting the submatrix 460 up by three elements along the first diagonal $k_1$).

Also shown in FIGS. 9B and 9C, another submatrix 465 (illustrated by a dotted area) corresponds to an overlap of a non-matching portion of the lookahead buffer L and the longest matching substring in the window W (e.g., the longest matching substring "ABC"). The submatrix 465 need not be recomputed; it can be copied instead.

One or more unprocessed elements from the data block 55 that have not yet been inserted into the lookahead buffer L are next inserted into the lookahead buffer L. For example, if the longest matching substring in the window W is "ABC", the number of unprocessed elements inserted is the same as the length of "ABC" (i.e., three unprocessed elements from the data block 55 are inserted into the lookahead buffer L). A submatrix 470 comprises one or more rows of the matrix S that correspond to the unprocessed elements newly inserted into the lookahead buffer L. The submatrix 470 must be re-computed/updated. Specifically, the processors $P_1, \ldots, P_{num}$ compare the newly inserted unprocessed elements against elements of the window W, and the submatrix 470 is updated to include Boolean values indicative of results of the comparisons.

Figure 9D:
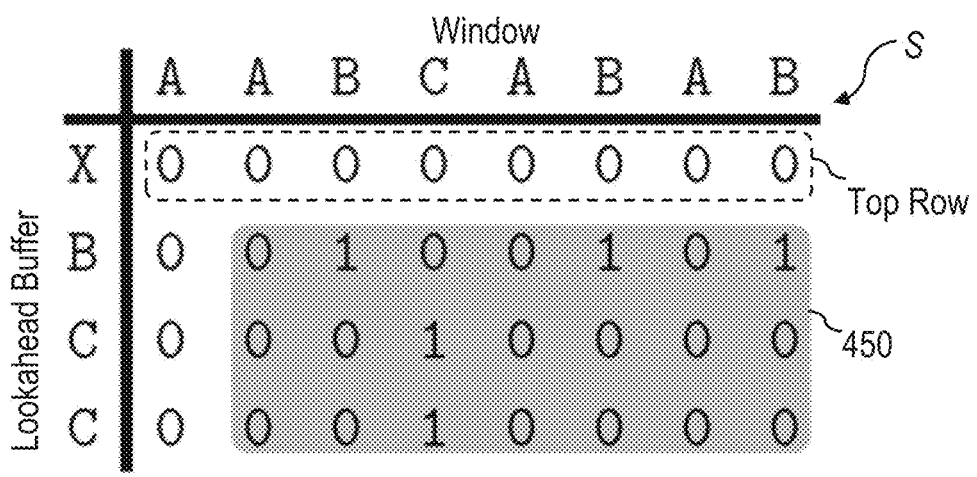
FIG. 9D illustrates an example matrix indicating that no match has been found, in accordance with an embodiment of the invention.

FIG. 9D illustrates an example matrix S indicating that no match has been found, in accordance with an embodiment of the invention. If the processors $P_1, \ldots, P_{num}$ do not encounter a match, each entry in the first/top row of the matrix S is zero. One of the processors $P_1, \ldots, P_{num}$ is singled out (randomly or statically) to emit a literal token with value "X". A submatrix 450 (illustrated by a shaded area) comprises entries of the matrix S that will be shifted one element up along a diagonal of the matrix S to reflect a shifting the head element L[1] (e.g., element "X") out of the lookahead buffer L and into the window W.

Figure 9E:
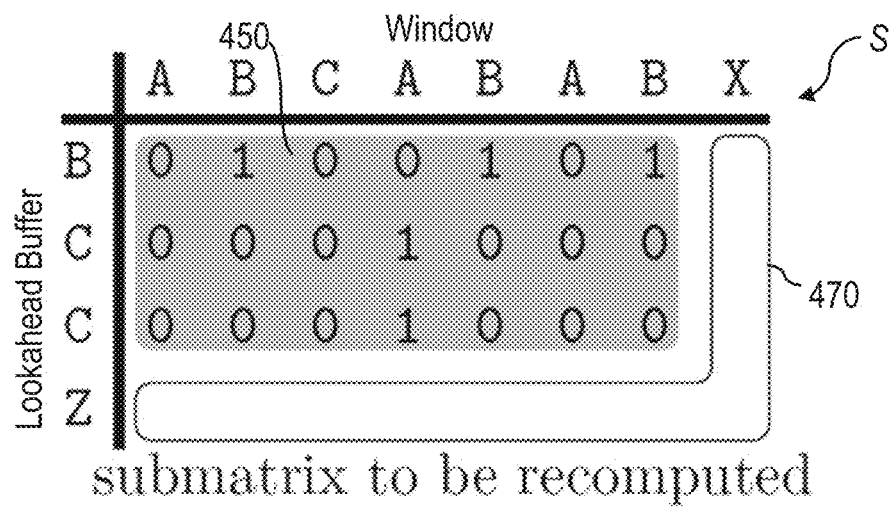
FIG. 9E illustrates an example matrix that has been updated after no match has been found, in accordance with an embodiment of the invention.

FIG. 9E illustrates an example matrix S that has been updated after no match has been found, in accordance with an embodiment of the invention. A submatrix 450 comprises entries of the matrix S that have been shifted one element up along a diagonal of the matrix S to reflect updates to the lookahead buffer L and the window W. An L-shaped portion 470 of the matrix S includes entries that need to be re-computed/updated after shifting a new unprocessed element from the data block 55 into the lookahead buffer L (e.g., element "Z").

Figure 10:
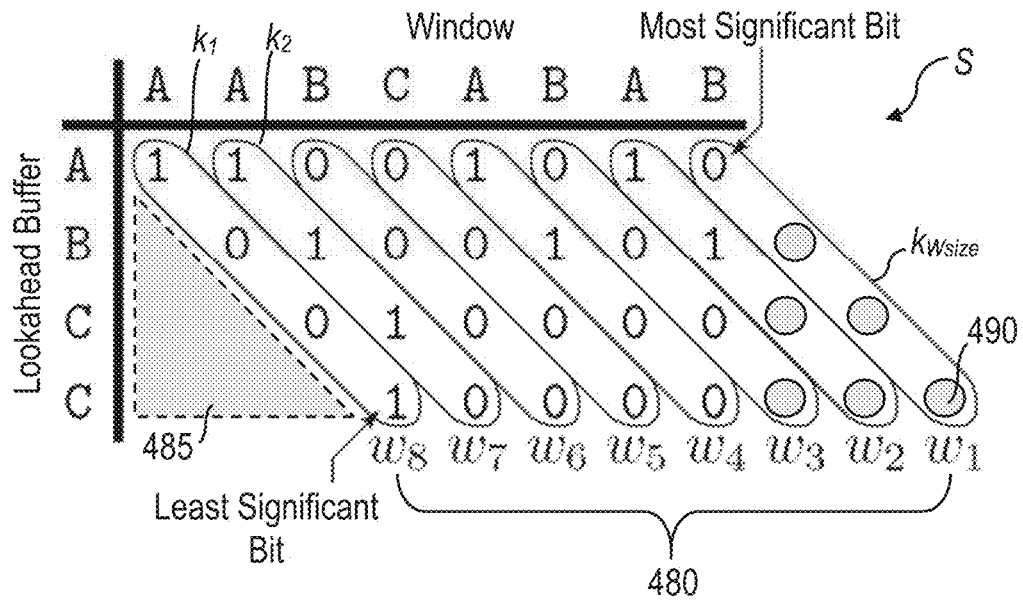
FIG. 10 illustrates an example representation of a matrix maintained in the compression system, in accordance with an embodiment of the invention.

FIG. 10 illustrates an example representation 480 of a matrix S maintained in the compression system 110, in accordance with an embodiment of the invention. A representation 480 of the matrix S is maintained in the compression system 110 to facilitate each of the following: (i) efficiently identify matches as sequences of ones positioned along diagonals of the matrix S, (ii) efficiently perform upper-left shift operations on the matrix S to reflect updates to the window W and the lookahead buffer L, and (iii) efficiently update portions of the matrix S with Boolean values indicative of results of comparisons involving elements newly inserted into the window W or the lookahead buffer L.

Let k generally denote a diagonal that begins at the first/top row of the matrix S, wherein the diagonal k corresponds to a specific start position in the window W. The matrix S has $W_{size}$ diagonals kin total. For example, as shown in FIG. 10, a first diagonal $k_1$ (i.e., main diagonal) of the matrix S corresponds to a start position $-W_{size}$ in the window W. Each diagonal k has a corresponding machine word $w_k$, wherein Boolean values included in the diagonal k are maintained/stored consecutively within the corresponding machine word $w_k$. The length of each diagonal k is equal to the length $L_{size}$ of the lookahead buffer L. For example, as shown in FIG. 10, machine words $w_8$, $w_7$, ..., $w_1$ correspond to the first diagonal $k_1$, a second diagonal $k_2$, ..., a last diagonal $k_{Wsize}$, respectively.

Not all entries of the matrix S may be included in the representation. For example, as shown in FIG. 10, a lower triangular portion 485 (illustrated by dotted shaded area) of the matrix S that is located below the first diagonal $k_1$ may not be included as upper-left shift operations always occur along the first diagonal $k_1$; as such, entries included in the lower triangular portion 485 never cross the first diagonal $k_1$.

One or more diagonals k trailing at the end of the matrix S may include one or more "empty" elements 490 that do not correspond to valid entries of the matrix S.

Let S' denote a reduced matrix comprising an array of diagonals, wherein each diagonal k is represented as a contiguous sequence of machines words $w_k$ with a total length of $L_{size}$ bits. Therefore, the size of a diagonal k and the length of the longest possible match is not limited to machine word size of the underlying hardware architecture. In one embodiment, a reduced matrix S' may be represented in accordance with equation (2) provided below:

$$S'=[w_1, \ldots, w_{Wsize}] \qquad (2).$$

Assume $L_{size}$=4 bits and, for simplicity, each diagonal k for this illustrative example can be represented by one machine word. For example, as shown in FIG. 10, $w_8$=1001, and $w_7$=1110. Using equation (2) provided above, S'=[0____, 11___, 000__, 1100, 0000, 0000, 1110, 1001], wherein a __ denotes a logical "don't-care" element 490. A first bit of machine word $w_1$ is the most significant bit of the representation 480. A last bit of machine word $w_8$ is the least significant bit of the representation 480. Representing the reduced matrix S' in accordance with equation (2) provided above allows both efficient updates and identification of matches.

In one embodiment, a match and its length may be determined by counting the number of leading ones along a diagonal k that corresponds to a specific start position in the window W. The processors $P_1, \ldots, P_{num}$ may offer direct hardware support for such operation, either directly or through software-emulation via a negation followed by a complement instruction (i.e., counting the number of leading zeros).

In one embodiment, an upper-left-shift operation may be implemented using a simple logic left shift operation. If the diagonals of the matrix S span multiple machine words, the corresponding shift has to operate across word boundaries.

In one embodiment, one or more rows of the matrix S is re-computed/updated in response to a shift resulting from a match (e.g., FIG. 9C). In one embodiment, an L-shaped portion of the matrix S is re-computed/updated in response to a shift that does not result from a match (e.g., FIG. 9E). Both types of updates may be implemented in parallel, such that each processor $P_i$ updates at most one diagonal k. Using this layout, no conflicts (Write-after-Write WaW, Write-after-Read WAR) will arise between the processors $P_1, \ldots, P_{num}$.

Figure 11:
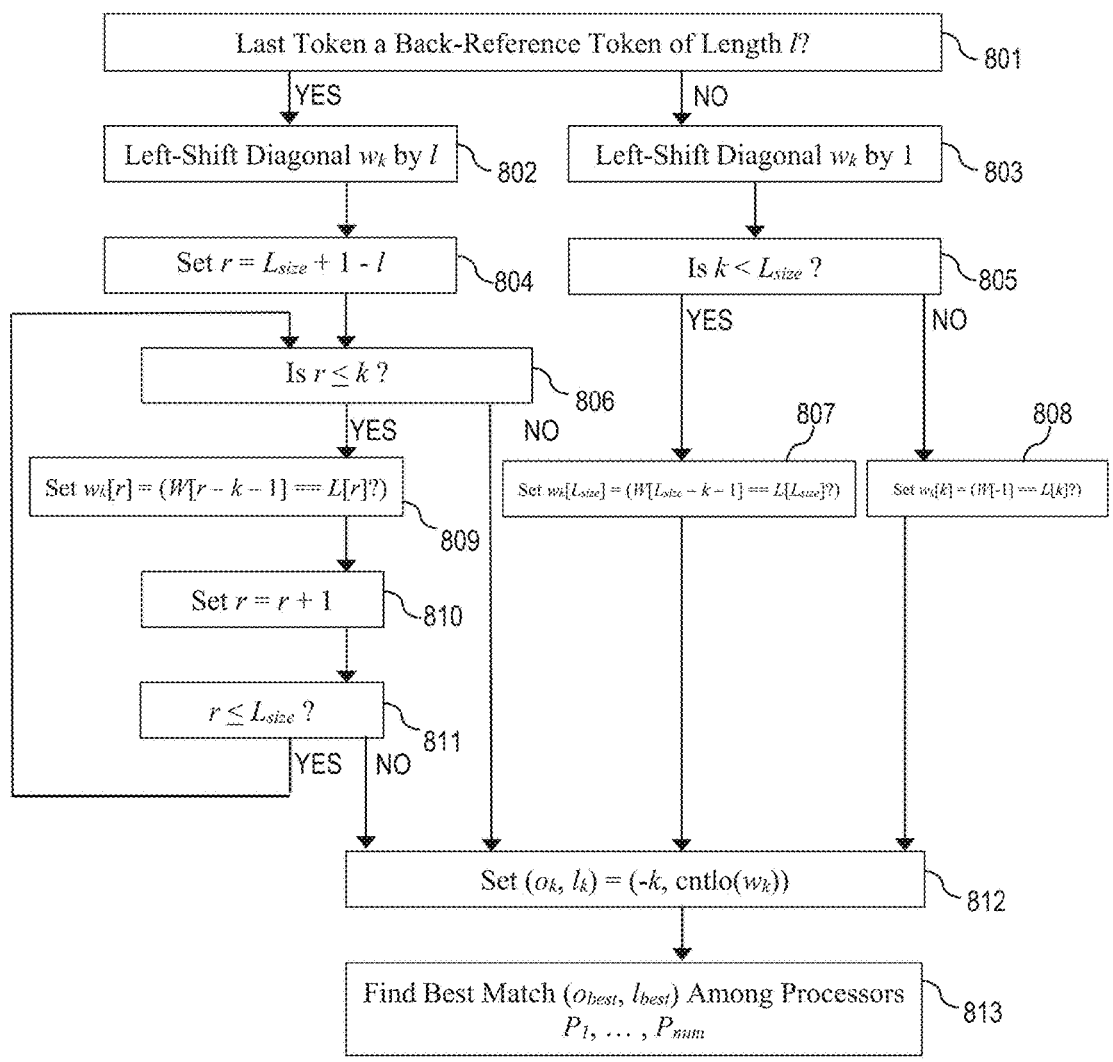
FIG. 11 illustrates a flowchart of an example process for minimal comparison matching performed by a processor set, in accordance with an embodiment of the invention.

FIG. 11 illustrates a flowchart of an example process 800 for minimal comparison matching performed by a processor set, in accordance with an embodiment of the invention. In process block 801, determine, for each processor $P_i$ of a processor set P assigned to a data block, whether a last token emitted by the processor $P_i$ is a back-reference token of length 1. If the last token emitted is a back-reference token and has length 1, proceed to process block 802. If the last token emitted is not a back-reference token (i.e., the last token emitted is a literal token), proceed to process block 803.

In process block 802, an upper-left-shift operation is applied to a reduced matrix S' to shift entries included in machine word $w_k$ up along a diagonal k by 1 elements. In process block 804, set r=$L_{size}$+1−1. In process block 806, determine whether r is less than or equal to k. If r is less than or equal to k, proceed to process block 809. If r is greater than k, proceed to process block 812. In process block 809, perform a comparison between W[r−k−1] and L[r], and set $w_k$[r] to a Boolean value indicative of a result of the comparison. In process block 810, increment r. In process block 811, determine whether r is less than or equal to $L_{size}$. If r is less than or equal to $L_{size}$, return to process block 805. If r is greater than $L_{size}$, proceed to process block 812.

In process block 803, an upper-left-shift operation is applied to a reduced matrix S' to shift entries included in machine word $w_k$ up along a diagonal k by 1 element. In process block 805, determine whether k is less than $L_{size}$. If k is less than $L_{size}$, proceed to process block 807. If k is equal to or greater than $L_{size}$, proceed to process block 808. In process block 807, perform a comparison between W[$L_{size}$−k−1] and L[$L_{size}$], and set $w_k$[$L_{size}$] to a Boolean value indicative of a result of the comparison. In process block 808, perform a comparison between W[−1] and L[k], and set $w_k$[k] to a Boolean value indicative of a result of the comparison.

In process block 812, set $(o_k, l_k)$=(−k, cntlo($w_k$)), wherein cntlo($w_k$) denotes a number of leading ones in $w_k$. In process block 813, find the best match $(o_{best}, l_{best})$ among the processors $P_1, \ldots, P_{num}$ of the processor set P, (i.e., the match with the largest $l_{best}$ value and where ties are resolved by choosing the match with the smallest $o_{best}$ value).

Process blocks 801-812 are executed by each processor $P_i$ in parallel.

In one embodiment, process blocks 801-812 may be performed by the compression system 110 utilizing a processor set 105 and a compressor 420.

Figure 12:
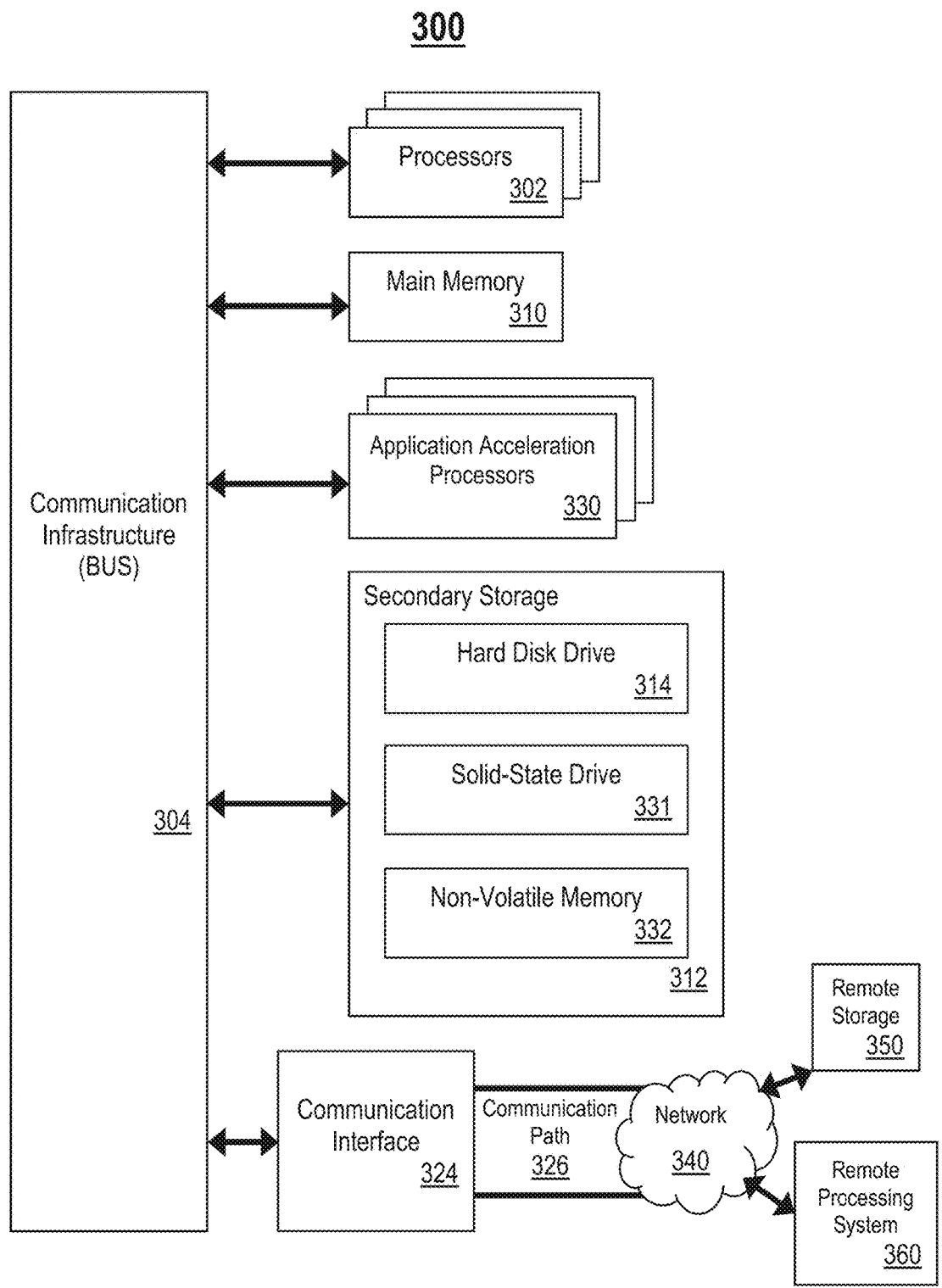
FIG. 12 is a high level block diagram showing an information processing system useful for implementing an embodiment of the present invention.

FIG. 12 is a high level block diagram showing an information processing system 300 useful for implementing one embodiment of the invention. The computer system includes a set of processors 302. Each processor 302 is connected to a communication infrastructure 304 (e.g., a communications bus, cross-over bar, or network).

The computer system may also include a set of specialized processor devices, such as application acceleration processors 330 (e.g., GPUs, FPGAs, etc.). Each application acceleration processor 330 is connected to a communication infrastructure 304 (e.g., a communications bus, cross-over bar, or network).

The computer system also includes a main memory 310, preferably random access memory (RAM), and may also include a secondary storage 312. The secondary storage 312 may include, for example, a hard disk drive 314, a solid-state drive 331, and/or a non-volatile memory 332. In alternative embodiments, the secondary storage 312 may include other similar means for allowing computer programs or other instructions to be loaded into the computer system.

The computer system may also include a communication interface 324. Communication interface 324 allows software and data to be transferred between the computer system and external devices via a network 340, such as a remote storage device 350, a remote processing system 360, etc. Examples of communication interface 324 may include a modem, a network interface (such as an Ethernet card), a communication port, etc. Software and data transferred via communication interface 324 are in the form of signals which may be, for example, electronic, electromagnetic, optical, or other signals capable of being received by communication interface 324. These signals are provided to communication interface 324 via a communication path (i.e., channel) 326. This communication path 326 carries signals and may be implemented using wire or cable, fiber optics, a phone line, a cellular phone link, an RF link, and/or other communication channels.

The present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

From the above description, it can be seen that the present invention provides a system, computer program product, and method for implementing the embodiments of the invention. The present invention further provides a non-transitory computer-useable storage medium for implementing the embodiments of the invention. The non-transitory computer-useable storage medium has a computer-readable program, wherein the program upon being processed on a computer causes the computer to implement the steps of the present invention according to the embodiments described herein. References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:

receiving an input data stream;

partitioning the input data stream into a plurality of data blocks;

compressing the data blocks utilizing a plurality of processor sets, wherein each processor set is assigned a data block to compress, the processor sets compress in parallel to exploit inter-block parallelism, each processor set comprises one or more processors that collaborate in compressing an assigned data block to exploit intra-block parallelism, and the compressing comprises:

at each processor of the processor set:

maintaining a multi-dimensional matrix comprising information indicative of results of multiple comparisons performed in parallel between processed elements of the assigned data block and unprocessed elements of the assigned data block;

individually identifying one or more sequences of the processed elements that matches one or more sequences of the unprocessed elements based on the matrix; and determining which of matching sequences individually identified by the processor is the longest; and writing a plurality of compressed data blocks resulting from the compressing to a storage device in encoded form.

2. The method of claim 1, wherein the compressing comprises:

for each processor set:

maintaining a corresponding window for maintaining one or more processed elements of an assigned data block;

maintaining a corresponding lookahead buffer for maintaining one or more unprocessed elements of the assigned data block;

utilizing each processor of the processor set to collectively fill the corresponding lookahead buffer with one or more unprocessed elements from the assigned data block; and maintaining a corresponding comparison results matrix comprising a plurality of entries, wherein each entry comprises a bit value indicative of a result of a comparison between a processed element of the corresponding window and an unprocessed element of the corresponding lookahead buffer.

3. The method of claim 2, wherein the compressing comprises:

for each processor set:

utilizing each processor of the processor set to collectively determine, based on a corresponding comparison results matrix, a longest matching substring within a corresponding window that matches one or more unprocessed elements of a corresponding lookahead buffer.

4. The method of claim 3, wherein the compressing comprises:
for processor of each processor set:
determining whether there are one or more matching substrings within a corresponding window that matches one or more unprocessed elements of a corresponding lookahead buffer by identifying one or more sequences of ones positioned along one or more diagonals of a corresponding comparison results matrix, wherein each diagonal and each sequence of ones identified begins at a top row of the corresponding comparison results matrix and corresponds to a start position in the corresponding window, and each sequence of ones identified represents a matching substring;
for each sequence of ones identified, determining a length of a matching substring represented by the sequence of ones based on the number of leading ones included in the sequence identified; and
determining a longest matching substring individually identified by the processor based on each length of each matching substring represented by each sequence of ones identified.

5. The method of claim 4, wherein each diagonal is represented as a contiguous sequence of machine words.

6. The method of claim 4, wherein the compressing comprises:
for each processor set:
utilizing each processor of the processor set to collectively determine a longest matching substring among all longest matching substrings each processor of the processor set has individually identified.

7. The method of claim 6, wherein the compressing comprises:
for each processor set:
shifting a longest matching substring collectively determined by each processor of the processor set out of a corresponding lookahead buffer and into a corresponding window;
inserting one or more new unprocessed elements from an assigned data block into the corresponding lookahead buffer;
shifting a first submatrix of a corresponding comparison results matrix up along a first diagonal of the matrix by the same number of elements as a length of the longest matching substring; and
updating a second submatrix of the corresponding comparison results matrix based in part on results of comparisons between processed elements of the corresponding window and the one or more new unprocessed elements inserted into the corresponding lookahead buffer, wherein the first submatrix and the second submatrix are different submatrices.

8. The method of claim 4, wherein the compressing comprises:
for each processor set:
in response to each processor of the processor set determining that there are no matching sub strings:
shifting a head element of a corresponding lookahead buffer out of the corresponding lookahead buffer and into a corresponding window;
inserting a new unprocessed element from an assigned data block into the corresponding lookahead buffer;
shifting a first submatrix of a corresponding comparison results matrix up along a first diagonal of the matrix by one element; and
updating a second submatrix of the corresponding comparison results matrix based in part on results of comparisons between processed elements of the corresponding window and the new unprocessed element inserted into the corresponding lookahead buffer, wherein the first submatrix and the second submatrix are different submatrices.

9. A system comprising:
at least one processor; and
a non-transitory processor-readable memory device storing instructions that when executed by the at least one processor causes the at least one processor to perform operations including:
receiving an input data stream;
partitioning the input data stream into a plurality of data blocks;
compressing the data blocks utilizing a plurality of processor sets, wherein each processor set is assigned a data block to compress, the processor sets compress in parallel to exploit inter-block parallelism, each processor set comprises one or more processors that collaborate in compressing an assigned data block to exploit intra-block parallelism, and the compressing comprises:
at each processor of the processor set:
maintaining a multi-dimensional matrix comprising information indicative of results of multiple comparisons performed in parallel between processed elements of the assigned data block and unprocessed elements of the assigned data block;
individually identifying one or more sequences of the processed elements that matches one or more sequences of the unprocessed elements based on the matrix; and
determining which of matching sequences individually identified by the processor is the longest; and
writing a plurality of compressed data blocks resulting from the compressing to a storage device in encoded form.

10. The system of claim 9, wherein the compressing comprises:
for each processor set:
maintaining a corresponding window for maintaining one or more processed elements of an assigned data block;
maintaining a corresponding lookahead buffer for maintaining one or more unprocessed elements of the assigned data block;
utilizing each processor of the processor set to collectively fill the corresponding lookahead buffer with one or more unprocessed elements from the assigned data block; and
maintaining a corresponding comparison results matrix comprising a plurality of entries, wherein each entry comprises a bit value indicative of a result of a comparison between a processed element of the corresponding window and an unprocessed element of the corresponding lookahead buffer.

11. The system of claim 10, wherein the compressing comprises:
for each processor set:
utilizing each processor of the processor set to collectively determine, based on a corresponding comparison results matrix, a longest matching substring within a corresponding window that matches one or more unprocessed elements of a corresponding lookahead buffer.

12. The system of claim 11, wherein the compressing comprises:
for processor of each processor set:
determining whether there are one or more matching sub strings within a corresponding window that matches one or more unprocessed elements of a corresponding lookahead buffer by identifying one or more sequences of ones positioned along one or more diagonals of a corresponding comparison results matrix, wherein each diagonal and each sequence of ones identified begins at a top row of the corresponding comparison results matrix and corresponds to a start position in the corresponding window, and each sequence of ones identified represents a matching substring;
for each sequence of ones identified, determining a length of a matching substring represented by the sequence of ones based on the number of leading ones included in the sequence identified; and
determining a longest matching sub string individually identified by the processor based on each length of each matching substring represented by each sequence of ones identified.

13. The system of claim 12, wherein each diagonal is represented as a contiguous sequence of machine words.

14. The system of claim 12, wherein the compressing comprises:
for each processor set:
utilizing each processor of the processor set to collectively determine a longest matching substring among all longest matching substrings each processor of the processor set has individually identified.

15. The system of claim 14, wherein the compressing comprises:
for each processor set:
shifting a longest matching substring collectively determined by each processor of the processor set out of a corresponding lookahead buffer and into a corresponding window;
inserting one or more new unprocessed elements from an assigned data block into the corresponding lookahead buffer;
shifting a first submatrix of a corresponding comparison results matrix up along a first diagonal of the matrix by the same number of elements as a length of the longest matching substring; and
updating a second submatrix of the corresponding comparison results matrix based in part on results of comparisons between processed elements of the corresponding window and the one or more new unprocessed elements inserted into the corresponding lookahead buffer, wherein the first submatrix and the second submatrix are different submatrices.

16. The system of claim 12, wherein the compressing comprises:
for each processor set:
in response to each processor of the processor set determining that there are no matching sub strings:
shifting a head element of a corresponding lookahead buffer out of the corresponding lookahead buffer and into a corresponding window;
inserting a new unprocessed element from an assigned data block into the corresponding lookahead buffer;
shifting a first submatrix of a corresponding comparison results matrix up along a first diagonal of the matrix by one element; and
updating a second submatrix of the corresponding comparison results matrix based in part on results of comparisons between processed elements of the corresponding window and the new unprocessed element inserted into the corresponding lookahead buffer, wherein the first submatrix and the second submatrix are different submatrices.

17. A computer program product comprising a computer-readable hardware storage medium having program code embodied therewith, the program code being executable by a computer to implement a method comprising:
receiving an input data stream;
partitioning the input data stream into a plurality of data blocks;
compressing the data blocks utilizing a plurality of processor sets, wherein each processor set is assigned a data block to compress, the processor sets compress in parallel to exploit inter-block parallelism, each processor set comprises one or more processors that collaborate in compressing an assigned data block to exploit intra-block parallelism, and the compressing comprises:
at each processor of the processor set:
maintaining a multi-dimensional matrix comprising information indicative of results of multiple comparisons performed in parallel between processed elements of the assigned data block and unprocessed elements of the assigned data block;
individually identifying one or more sequences of the processed elements that matches one or more sequences of the unprocessed elements based on the matrix; and
determining which of matching sequences individually identified by the processor is the longest; and
writing a plurality of compressed data blocks resulting from the compressing to a storage device in encoded form.

18. The computer program product of claim 17, wherein the compressing comprises:
for each processor set:
maintaining a corresponding window for maintaining one or more processed elements of an assigned data block;
maintaining a corresponding lookahead buffer for maintaining one or more unprocessed elements of the assigned data block;
utilizing each processor of the processor set to collectively fill the corresponding lookahead buffer with one or more unprocessed elements from the assigned data block; and
maintaining a corresponding comparison results matrix comprising a plurality of entries, wherein each entry comprises a bit value indicative of a result of a comparison between a processed element of the corresponding window and an unprocessed element of the corresponding lookahead buffer.

19. The computer program product of claim 18, wherein the compressing comprises:
for each processor set:
utilizing each processor of the processor set to collectively determine, based on a corresponding comparison results matrix, a longest matching substring within a corresponding window that matches one or more unprocessed elements of a corresponding lookahead buffer.

20. The computer program product of claim 19, wherein the compressing comprises:

for processor of each processor set:
- determining whether there are one or more matching sub strings within a corresponding window that matches one or more unprocessed elements of a corresponding lookahead buffer by identifying one or more sequences of ones positioned along one or more diagonals of a corresponding comparison results matrix, wherein each diagonal and each sequence of ones identified begins at a top row of the corresponding comparison results matrix and corresponds to a start position in the corresponding window, and each sequence of ones identified represents a matching substring;
- for each sequence of ones identified, determining a length of a matching substring represented by the sequence of ones based on the number of leading ones included in the sequence identified; and
- determining a longest matching substring individually identified by the processor based on each length of each matching substring represented by each sequence of ones identified.

* * * * *